(12) United States Patent
Moschiano et al.

(10) Patent No.: US 10,950,316 B2
(45) Date of Patent: Mar. 16, 2021

(54) APPARATUS FOR DETERMINING A PASS VOLTAGE OF A READ OPERATION

(71) Applicant: MICRON TECHNOLOGY, INC., Boise, ID (US)

(72) Inventors: Violante Moschiano, Avezzano (IT); Tecla Ghilardi, Trescore B. (IT); Tommaso Vali, Sezze (IT); Emilio Camerlenghi, Bergamo (IT); William C. Filipiak, Boise, ID (US); Andrea D'Alessandro, L'Aquila (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/990,137

(22) Filed: Aug. 11, 2020

(65) Prior Publication Data

US 2020/0372961 A1 Nov. 26, 2020

Related U.S. Application Data

(63) Continuation of application No. 16/267,488, filed on Feb. 5, 2019, now Pat. No. 10,777,286.

(60) Provisional application No. 62/785,731, filed on Dec. 28, 2018.

(51) Int. Cl.
| | |
|---|---|
| *G11C 16/26* | (2006.01) |
| *G11C 16/34* | (2006.01) |
| *G11C 5/06* | (2006.01) |
| *G11C 11/413* | (2006.01) |
| *G11C 8/08* | (2006.01) |

(52) U.S. Cl.
CPC .......... *G11C 16/3404* (2013.01); *G11C 5/063* (2013.01); *G11C 8/08* (2013.01); *G11C 11/413* (2013.01); *G11C 16/26* (2013.01)

(58) Field of Classification Search
CPC ..... G11C 16/10; G11C 16/26; G11C 16/3404; G11C 5/063; G11C 8/08; G11C 11/413
USPC ........................................ 365/185.14, 185.24
See application file for complete search history.

(56) References Cited

U.S. PATENT DOCUMENTS

| | | | | |
|---|---|---|---|---|
| 5,673,223 | A * | 9/1997 | Park ........................ | G11C 16/08 365/185.17 |
| 5,726,934 | A | 3/1998 | Tran et al. | |
| 9,336,892 | B1 | 5/2016 | Chen et al. | |
| 10,026,486 | B1 | 7/2018 | Dutta et al. | |
| 2002/0186591 | A1 * | 12/2002 | Lee .......................... | G11C 7/18 365/185.17 |
| 2003/0117856 | A1 * | 6/2003 | Lee ...................... | G11C 7/1087 365/189.05 |

(Continued)

OTHER PUBLICATIONS

Maejima, H., et al. "A 512Gb 3b/Cell 3D Flash Memory on a 96-Word-Line-Layer Technology," 2018 IEEE International Solid-State Circuits Conference, Session 20, Flash Memory Solutions, 20.1, Digest of Technical Papers, Feb. 14, 2018, pp. 336-337.

*Primary Examiner* — Michael T Tran
(74) *Attorney, Agent, or Firm* — Dicke, Billig & Czaja, PLLC

(57) ABSTRACT

Apparatus having plurality of data lines each selectively connected to a respective string of series-connected memory cells, a plurality of registers each configured to indicate a state of a respective data line, and logic configured to indicate when each data line of the plurality of data lines has a particular state might facilitate determination of a pass voltage of a read operation.

20 Claims, 13 Drawing Sheets

(56) References Cited

U.S. PATENT DOCUMENTS

| | | | |
|---|---|---|---|
| 2007/0263462 A1* | 11/2007 | Roohparvar | G11C 16/0483 365/198 |
| 2008/0181032 A1* | 7/2008 | Yu | G11C 11/5642 365/194 |
| 2008/0183950 A1* | 7/2008 | Roohparvar | G11C 19/0858 711/103 |
| 2008/0189478 A1* | 8/2008 | Chae | G06F 12/0246 711/103 |
| 2009/0190401 A1* | 7/2009 | Jeon | G11C 16/0483 365/185.05 |
| 2009/0201738 A1* | 8/2009 | Sato | G11C 16/0483 365/185.17 |
| 2010/0149867 A1* | 6/2010 | Tanaka | G11C 16/0483 365/185.03 |
| 2011/0069546 A1* | 3/2011 | Watanabe | G11C 16/3454 365/185.03 |
| 2011/0199833 A1 | 8/2011 | Shim et al. | |
| 2011/0289376 A1 | 11/2011 | Maccarrone et al. | |
| 2012/0020155 A1* | 1/2012 | Kim | G11C 16/10 365/185.03 |
| 2012/0075934 A1* | 3/2012 | Louie | G11C 16/26 365/185.23 |
| 2012/0228947 A1 | 9/2012 | Noy | |
| 2012/0281479 A1* | 11/2012 | Kochar | G11C 29/025 365/185.19 |
| 2012/0314499 A1* | 12/2012 | Yuan | G11C 16/349 365/185.11 |
| 2013/0015517 A1 | 1/2013 | Widjaja et al. | |
| 2013/0028017 A1* | 1/2013 | Hendrickson | G11C 16/0483 365/185.03 |
| 2013/0051142 A1* | 2/2013 | Sakui | G11C 16/0408 365/185.05 |
| 2013/0070524 A1* | 3/2013 | Dutta | G11C 11/5642 365/185.03 |
| 2013/0077399 A1* | 3/2013 | Kang | G11C 16/349 365/185.2 |
| 2013/0314995 A1 | 11/2013 | Dutta et al. | |
| 2014/0247663 A1 | 9/2014 | Yuan et al. | |
| 2014/0340964 A1 | 11/2014 | Shino et al. | |
| 2015/0009760 A1 | 1/2015 | Nam et al. | |
| 2015/0019886 A1* | 1/2015 | Lim | G11C 16/26 713/310 |
| 2015/0078097 A1 | 3/2015 | Yano | |
| 2015/0348634 A1* | 12/2015 | Koo | G11C 16/16 365/185.12 |
| 2017/0352430 A1 | 12/2017 | Chen et al. | |
| 2018/0053543 A1* | 2/2018 | Lee | G11C 16/10 |
| 2018/0061504 A1 | 3/2018 | Kim et al. | |
| 2018/0137920 A1* | 5/2018 | Song | G11C 16/26 |
| 2018/0137925 A1 | 5/2018 | Nam et al. | |
| 2018/0197611 A1 | 7/2018 | Kimura | |
| 2018/0204625 A1 | 7/2018 | Hioka | |
| 2018/0240515 A1* | 8/2018 | Shibata | G11C 16/0483 |
| 2018/0294031 A1 | 10/2018 | Seo | |
| 2018/0322918 A1* | 11/2018 | Alam | G11C 11/1657 |
| 2019/0057749 A1 | 2/2019 | Chen et al. | |
| 2019/0102104 A1 | 4/2019 | Righetti et al. | |
| 2019/0130982 A1 | 5/2019 | Reusswig et al. | |
| 2020/0066363 A1 | 2/2020 | Yang | |
| 2020/0111534 A1 | 4/2020 | Vali et al. | |
| 2020/0135266 A1 | 4/2020 | Kumar et al. | |

\* cited by examiner

|  $350_0$  |  $350_1$  |  $350_2$  |  $350_3$  |
|---|---|---|---|
| Block$_0$ $250_0$ | Block$_0$ $250_0$ | Block$_0$ $250_0$ | Block$_0$ $250_0$ |
| Block$_1$ $250_1$ | Block$_1$ $250_1$ | Block$_1$ $250_1$ | Block$_1$ $250_1$ |
| Block$_2$ $250_2$ | Block$_2$ $250_2$ | Block$_2$ $250_2$ | Block$_2$ $250_2$ |
| Block$_3$ $250_3$ | Block$_3$ $250_3$ | Block$_3$ $250_3$ | Block$_3$ $250_3$ |
| Block$_4$ $250_4$ | Block$_4$ $250_4$ | Block$_4$ $250_4$ | Block$_4$ $250_4$ |
| ⋮ | ⋮ | ⋮ | ⋮ |
| Block$_{L-4}$ $250_{L-4}$ | Block$_{L-4}$ $250_{L-4}$ | Block$_{L-4}$ $250_{L-4}$ | Block$_{L-4}$ $250_{L-4}$ |
| Block$_{L-3}$ $250_{L-3}$ | Block$_{L-3}$ $250_{L-3}$ | Block$_{L-3}$ $250_{L-3}$ | Block$_{L-3}$ $250_{L-3}$ |
| Block$_{L-2}$ $250_{L-2}$ | Block$_{L-2}$ $250_{L-2}$ | Block$_{L-2}$ $250_{L-2}$ | Block$_{L-2}$ $250_{L-2}$ |
| Block$_{L-1}$ $250_{L-1}$ | Block$_{L-1}$ $250_{L-1}$ | Block$_{L-1}$ $250_{L-1}$ | Block$_{L-1}$ $250_{L-1}$ |
| Block$_L$ $250_L$ | Block$_L$ $250_L$ | Block$_L$ $250_L$ | Block$_L$ $250_L$ |
| $240_0$ | $240_1$ | $240_2$ | $240_3$ |

APPARATUS FOR DETERMINING A PASS VOLTAGE OF A READ OPERATION

RELATED APPLICATIONS

This application is a Continuation of U.S. application Ser. No. 16/267,488, titled "APPARATUS AND METHODS FOR DETERMINING DATA STATES OF MEMORY CELLS," filed Feb. 5, 2019, (allowed), which is commonly assigned and incorporated herein by reference in its entirety, and which claims priority to U.S. Provisional Application No. 62/785,731, filed on Dec. 28, 2018, which is commonly assigned and incorporated by reference herein in its entirety.

TECHNICAL FIELD

The present disclosure relates generally to memory and, in particular, in one or more embodiments, the present disclosure relates to apparatus and methods for determining data states of memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of -0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is activated in response to a particular voltage applied to its control gate, such as by detecting whether a data line connected to the memory cell experiences a change in voltage level caused by current flow through the memory cell. As memory operation advances to represent additional data states per memory cell, the margins between adjacent Vt ranges can become smaller. This can lead to an inaccurate determination of the data state of a sensed memory cell if the Vt of the sensed memory cell shifts over time.

Threshold voltages of memory cells may shift due to such phenomena as quick charge loss (QCL). QCL is a de-trapping of electrons near a gate dielectric interface out to the channel region of the memory cell, and can cause a Vt shift shortly after a programming pulse. When a memory cell passes the verify operation, the programmed threshold voltage may appear to be higher due to the trapped charge in the gate dielectric. When the memory cell is read after the program operation has been completed, the memory cell may have a Vt that is lower than the Vt obtained during the program verify operation due to the charge in the gate dielectric leaking out to the channel region.

Threshold voltages of memory cells may further shift due to cumulative charge loss over the age of their programmed data, e.g., a period of time between programming the data and reading the data, referred to herein as data age. Such charge loss can become more pronounced as the data storage structures become smaller.

Furthermore, threshold voltages of memory cells may shift due to read disturb. In read disturb, the threshold voltage of a memory cell may shift in response to the voltage applied to the memory cell to facilitate access to the target memory cell selected for reading, e.g., increasing the threshold voltage of the memory cell.

BRIEF DESCRIPTION OF THE DRAWINGS

FIG. 3 is a block schematic of a portion of an array of memory cells as could be used in a memory of the type described with reference to FIG. 1.

DETAILED DESCRIPTION

Figure 1:
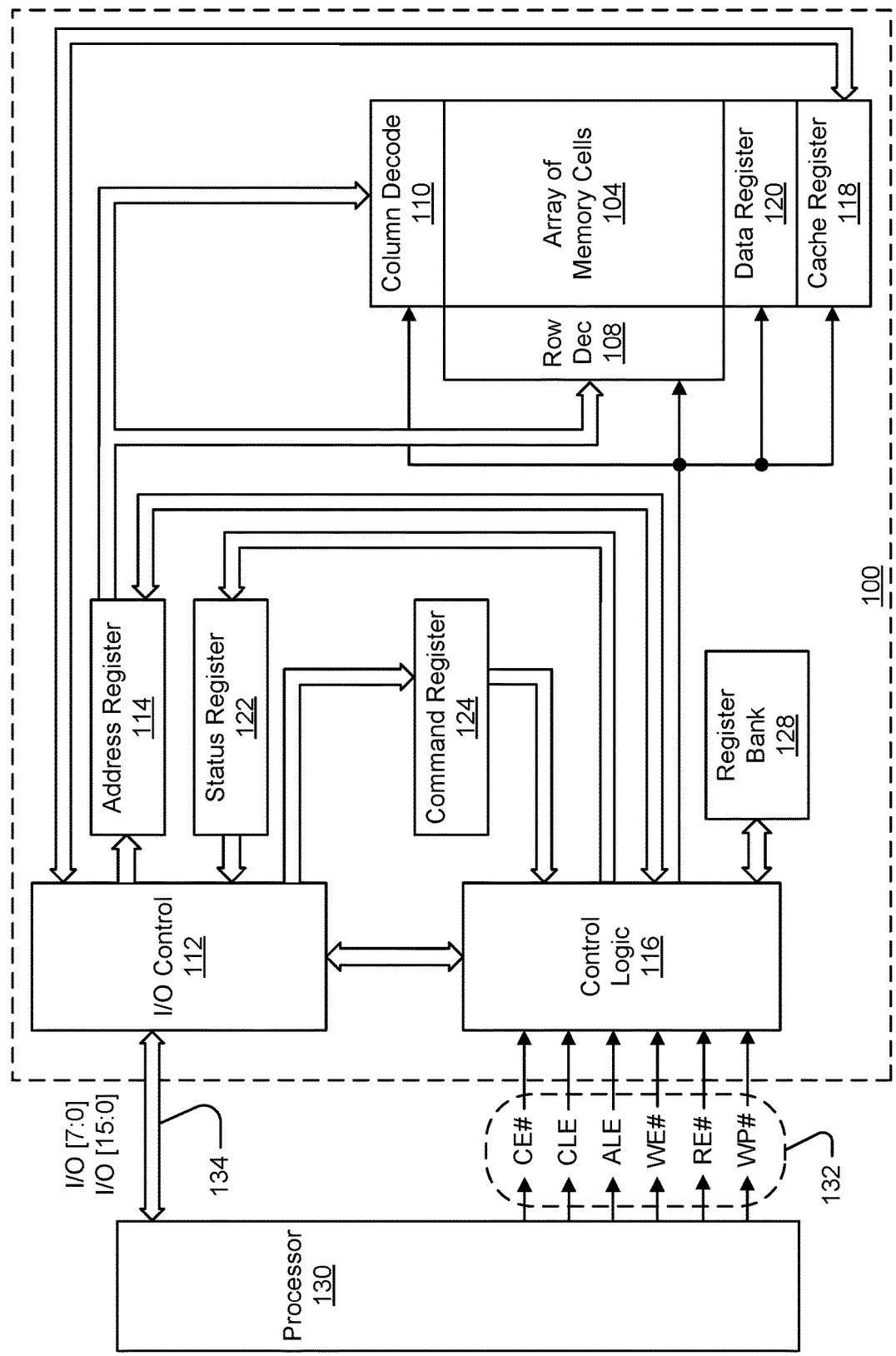
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A register bank 128 may be in communication with the control logic 116. The register bank 128 might represent a volatile memory, latches or other storage location. For some embodiments, the register bank 128 might represent a portion of the array of memory cells 104. The register bank 128 might store information relating to threshold voltages (e.g., highest threshold voltages) for groupings of memory cells in accordance with embodiments. The control logic 116 might be configured to perform methods of operating a memory in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
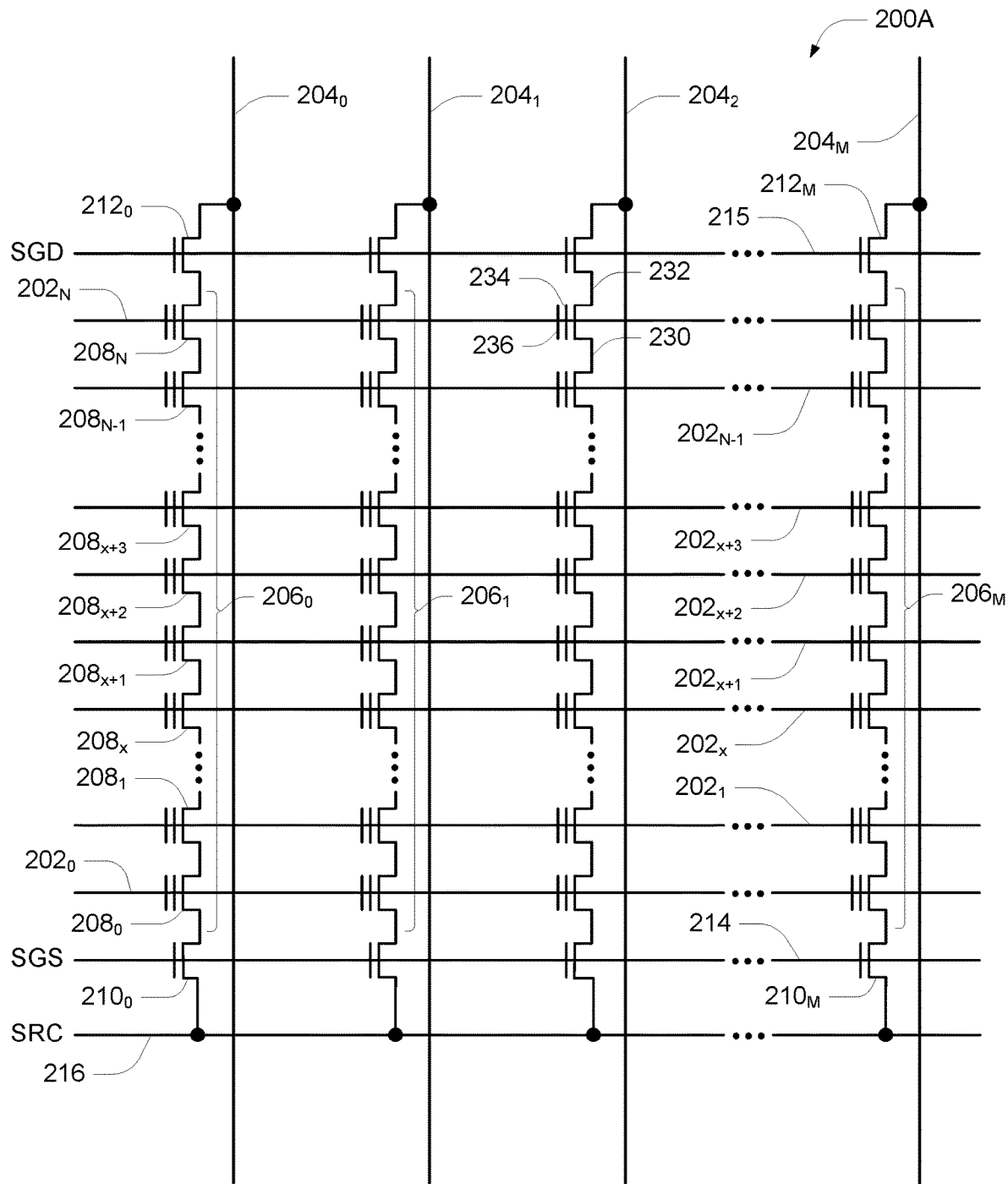
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data.

The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
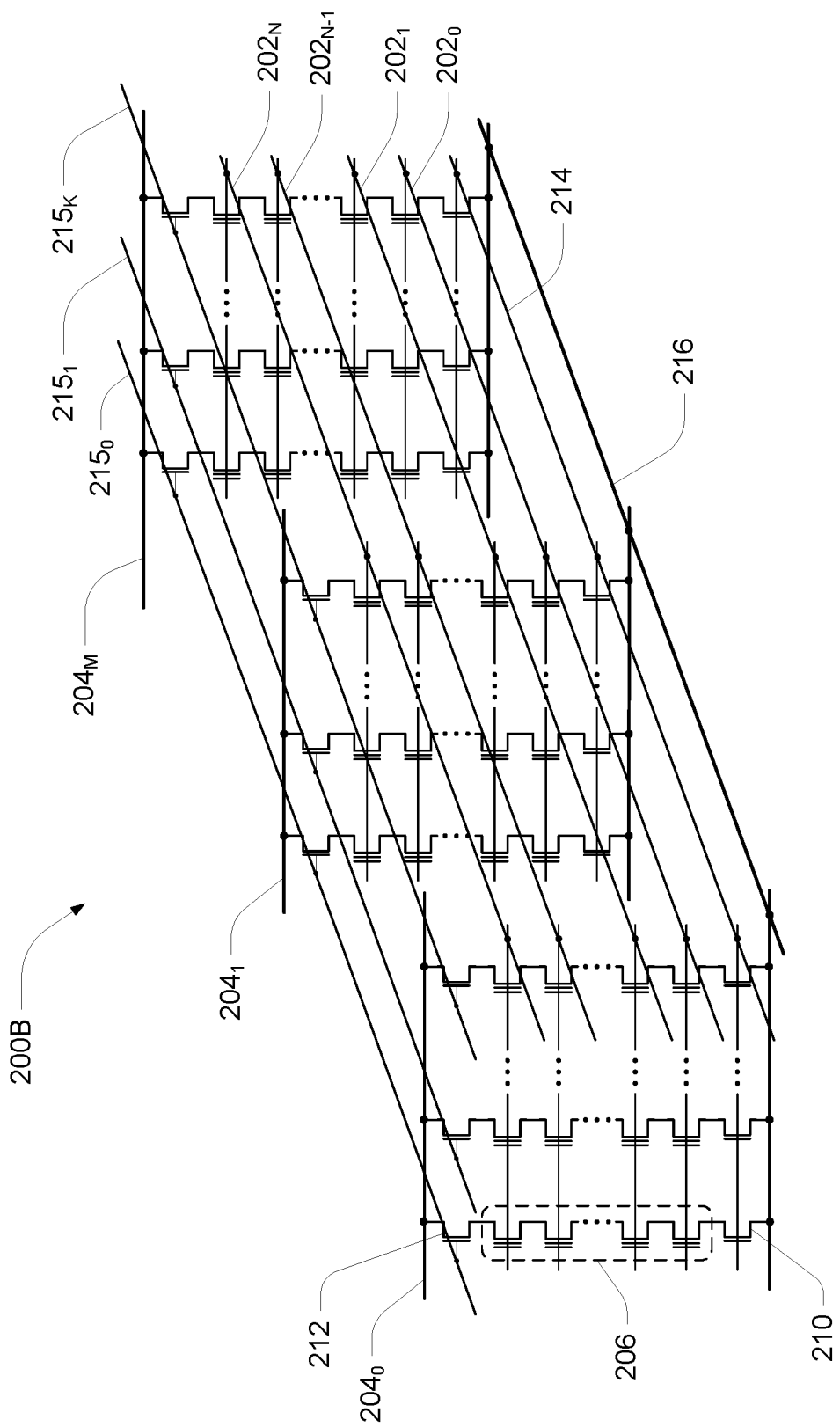

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
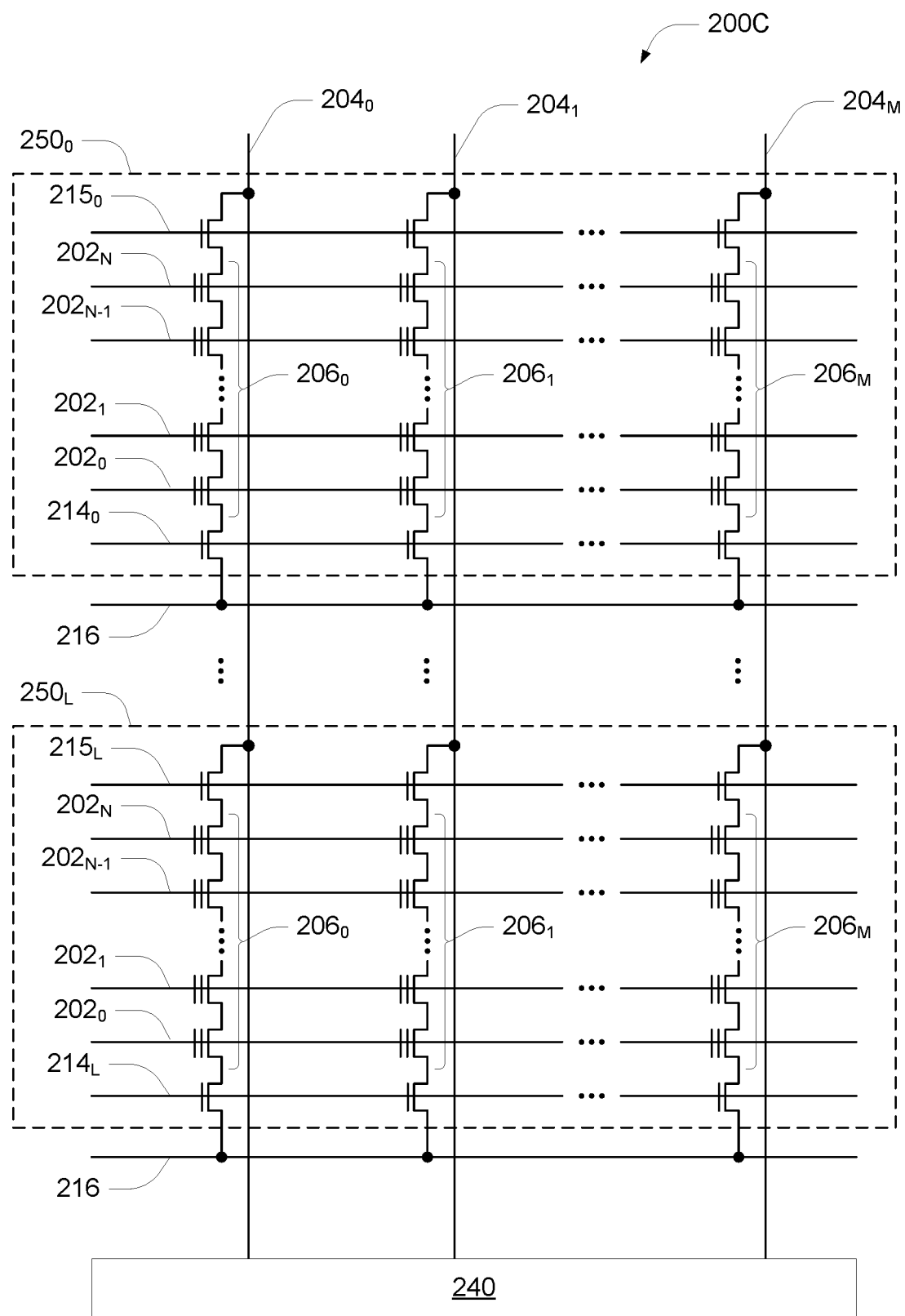

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sensing devices (not shown in FIG. 2C) for sensing data values indicated on respective data lines 204, and corresponding registers (not shown in FIG. 2C) for storage of the sensed data values from its corresponding memory plane.

FIG. 3 is a block schematic of a portion of an array of memory cells as could be used in a memory of the type described with reference to FIG. 1. The array of memory cells 300 is depicted to have four memory planes 350 (e.g., memory planes $350_0$-$350_3$), each in communication with a respective buffer portion 240, which might collectively form a page buffer 352. While four memory planes 350 are depicted, other numbers of memory planes 350 might be commonly in communication with a page buffer 352. Each memory plane 350 is depicted to include L+1 blocks of memory cells 250 (e.g., blocks of memory cells $250_0$-$250_L$).

Figure 4:
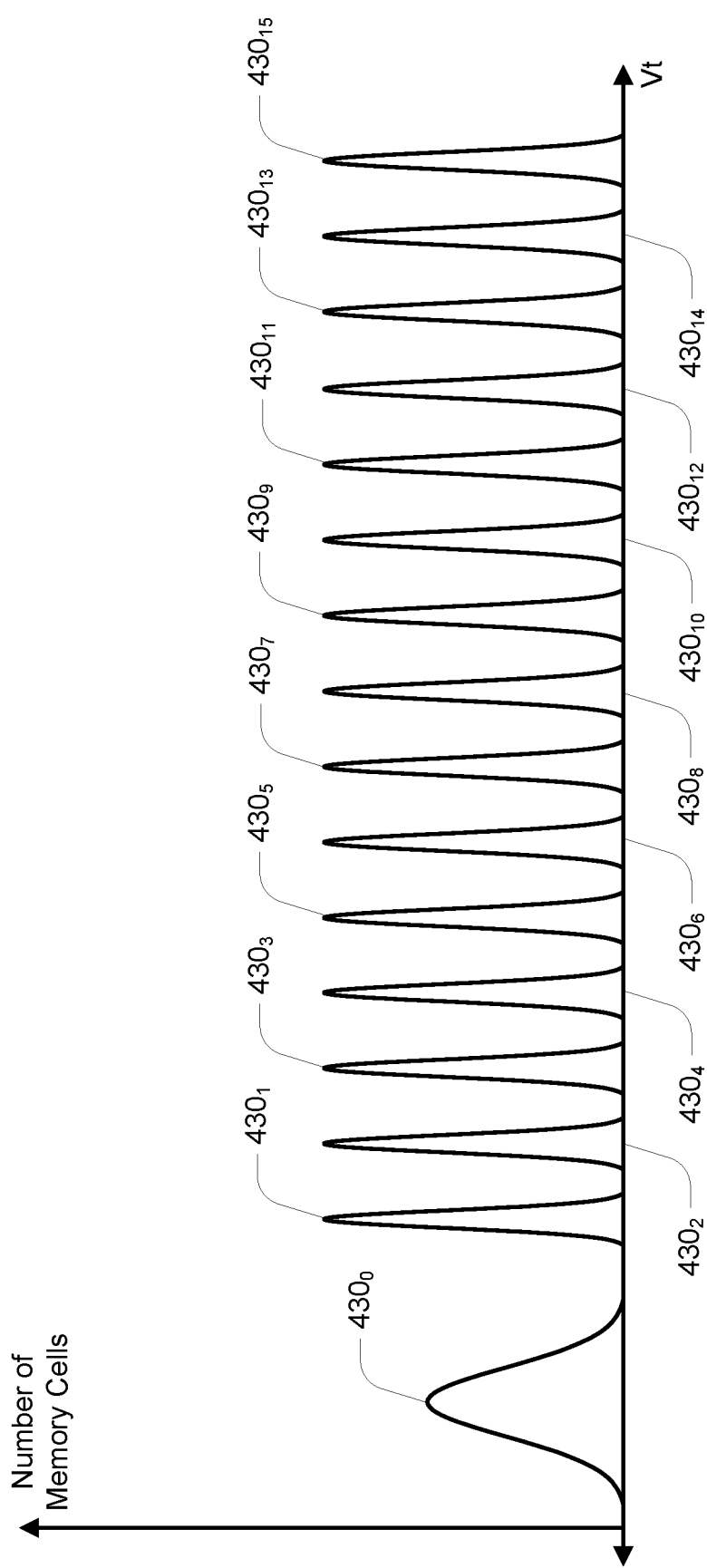
FIG. 4 is a conceptual depiction of threshold voltage distributions of a plurality of memory cells.

FIG. 4 is a conceptual depiction of threshold voltage ranges of a plurality of memory cells. FIG. 4 illustrates an example of threshold voltage ranges and their distributions for a population of a sixteen-level memory cells, often referred to as QLC memory cells. For example, such a memory cell might be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ may tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$ and $430_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case may be storing a data state L0 having a data value of logical '1111' and is typically referred to as the erased state of the memory cell. If the threshold voltage is within the second of the sixteen threshold voltage ranges $430_1$, the memory cell in this case may be storing a data state L1 having a data value of logical '0111'. If the threshold voltage is within the third of the sixteen threshold voltage ranges $430_2$, the memory cell in this case may be storing a data state L2 having a data value of logical '0011', and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 5:
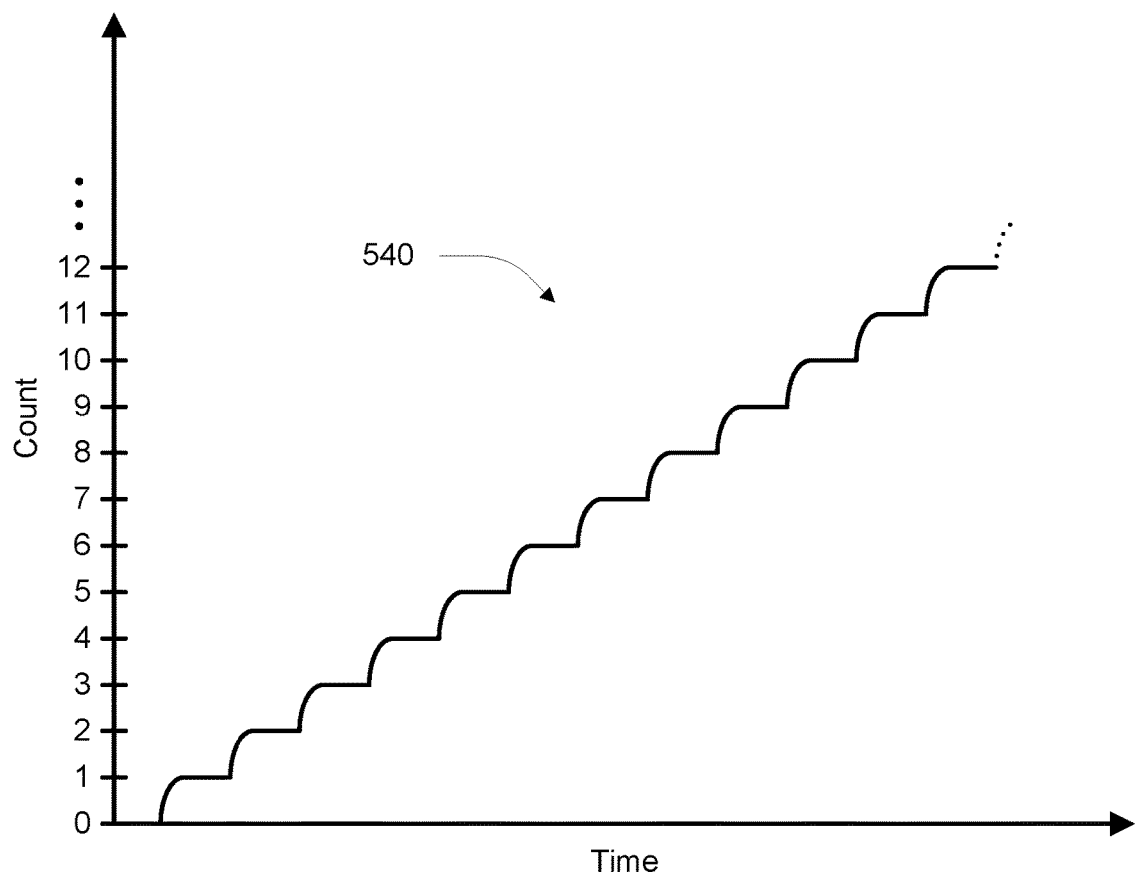
FIG. 5 is a depiction of an increasing voltage level for use with various embodiments.

FIG. 5 is a depiction of an increasing voltage level 540 for use with various embodiments. Various embodiments might use an increasing voltage level applied to access lines (e.g., each access line) during a precharge phase of a read operation, and might use an increasing voltage level applied to a selected access line during a sensing phase of the read operation. The increasing voltage level 540 might be responsive to a count. For example, as values of the counts increase, the voltage level of the increasing voltage level 540 might increase in response. The increasing voltage level 540 may approximate, or more closely approximate, a linear response by increasing the number of counts used to generate a same range of voltage levels.

Figure 6:
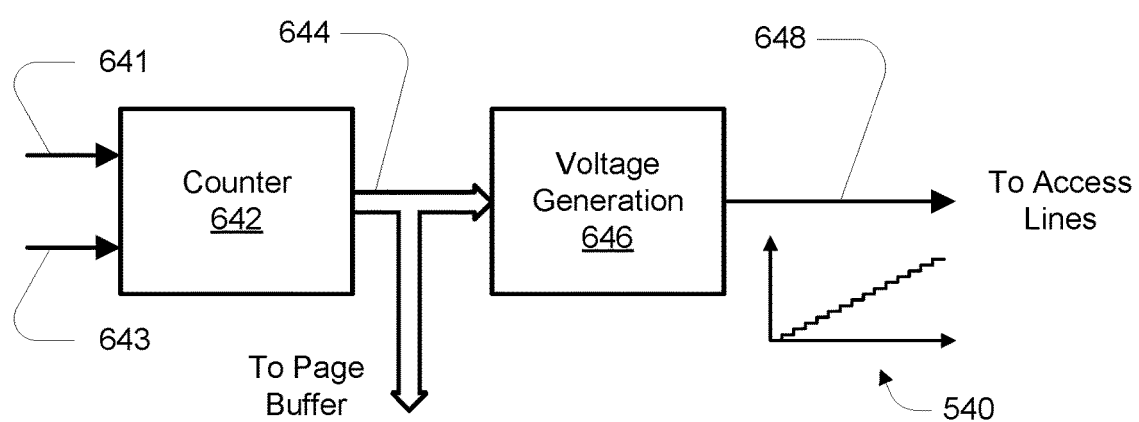
FIG. 6 is a block diagram of a voltage generation system for generating an increasing voltage level of the type depicted in FIG. 5 for use with various embodiments.

FIG. 6 is a block diagram of a voltage generation system for generating an increasing voltage level of the type depicted in FIG. 5 for use with various embodiments. The voltage generation system of FIG. 6 includes a counter 642 for producing a count. As an example, the counter 642 may have an output 644 for providing a bit pattern representative of the count. The counter 642 may be configured to receive an enable signal 641 to selectively enable or disable the counter, e.g., to hold the counter 642 at a last count. The counter 642 may further be configured to receive a reset signal 643 to reset a value of its count to an initial value, e.g., zero.

A voltage generation circuit 646, e.g., a digital-to-analog converter (DAC), might produce an analog voltage level responsive to the output 644 of the counter 642, e.g., responsive to the count. The DAC 646 might provide this voltage level at the output 648. The output 648 of the DAC 646 might be connected (e.g., selectively connected) to access lines (e.g., one or more access lines) of an array of memory cells. For example, the output 648 of the DAC 646 might be selectively connected to word lines 202 of FIGS. 2A-2C. The output 644 of the counter 642 might also be connected (e.g., selectively connected) to a page buffer of a memory, such as a portion of a data register 120 of FIG. 1. Multiple voltage generation systems might be used to provide differing voltage levels to different access lines.

Figure 7:
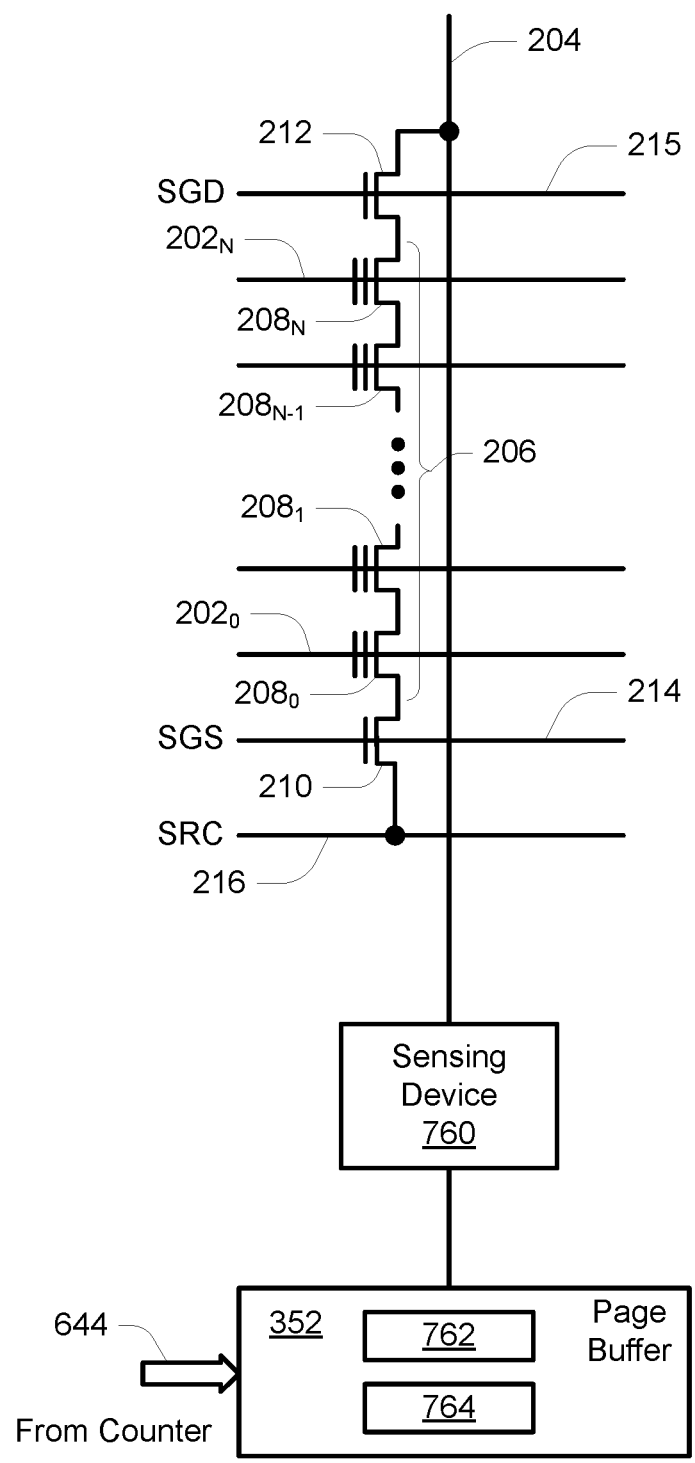
FIG. 7 is a block schematic depicting a connection of a data line to a sensing device and page buffer for use with various embodiments.

FIG. 7 is a block schematic depicting a connection of a data line to a sensing device and page buffer for use with various embodiments. In FIG. 7, a NAND string 206 is selectively connected to a data line 204 through a select gate 212, and to a source 216 through a select gate 210. The NAND string 206 might have the same structure as described with reference to FIG. 2A, having N+1 memory cells $208_0$-$208_N$. In reading the data state of one of the memory cells $208_0$-$208_N$, the select gates 210 and 212 might be activated, a read voltage might be applied to the access line (e.g., selected access line) connected to a memory cell selected for the read operation, e.g., a target memory cell, and a pass voltage might be applied to the access lines (e.g., unselected access lines) connected to each remaining memory cell of the NAND string 206. For example, if the memory cell $208_1$ is selected for the read operation, it might receive the read voltage at its control gate, where that read voltage is configured to activate the memory cell $208_1$ if its data state corresponds to a threshold voltage that is lower than or equal to the read voltage, and to deactivate the memory cell $208_1$ if its data state corresponds to a threshold voltage that is higher than the read voltage. Each remaining memory cell 208 (e.g., memory cells $208_0$ and $208_2$-$208_N$) might receive the pass voltage at their control gates, where that pass voltage is configured to activate each of the remaining memory cells 208 regardless of their data state.

The state of the data line 204 might indicate whether the target memory cell $208_1$ is in a state of activation or deactivation as current flow between the data line 204 and the source 216 might be enabled or inhibited, respectively. This property can then be sensed by a sensing device 760 connected to the data line 204, such as through a measurement of current flow or a resulting voltage level, or a comparison of current flow or resulting voltage level to some threshold value, e.g., using a differential amplifier or the like. The output of the sensing device 760 might be used to set one or more registers of a page buffer 352. For example, a first register 762 might be a one-digit (e.g., one bit) register having a first value (e.g., first logic level) indicative of the target memory cell $208_1$ being deactivated, e.g., in response to a sensing by the sensing device 760 indicating that current flow between the data line 204 and the source 216 is inhibited. The register 762 might further have a second value (e.g., second logic level different than the first logic level) indicative of the target memory cell $208_1$ being activated, e.g., in response to a sensing by the sensing device 760 indicating that current flow between the data line 204 and the source 216 is enabled. The page buffer 352 might further include a second register 764 that might be a multi-digit (e.g., multi-bit) register. In response to a sensing by the sensing device 760 indicating that current flow between the data line 204 and the source 216 is enabled, the page buffer 352 might be configured (e.g., in response to toggling the value of the first register 762 to its second value) to latch a representation of the count from the output 644 of the counter 642 into the register 764. In this manner, the register 764 might contain a representation of the threshold voltage of the target memory cell $208_1$, e.g., a representation of the voltage level at which the state of the data line 204 changed.

As memory cells are reduced in size, their associated data storage structures generally become smaller. In addition, as more levels of data states are stored to memory cells, differentiation between data states may become more difficult. Furthermore, threshold voltages of memory cells may shift due to read disturb and/or other phenomena, such as quick charge loss (QCL). In read disturb, the threshold voltage of a memory cell may shift in response to the voltage applied to the memory cell to facilitate access to the target memory cell selected for reading, e.g., increasing the threshold voltage of the memory cell. QCL is a de-trapping of electrons near a gate dielectric interface out to the channel region of the memory cell, and can cause an immediate Vt shift after a programming pulse. When a memory cell passes the verify operation, the programmed threshold voltage may appear to be higher due to the trapped charge in the gate dielectric. When the memory cell is read after the program operation has been completed, the memory cell may have a Vt that is different than the Vt obtained during the program verify operation due to one or more threshold voltage shifting phenomena. Various embodiments provide apparatus and methods that may facilitate a mitigation of these concerns.

Figure 8:
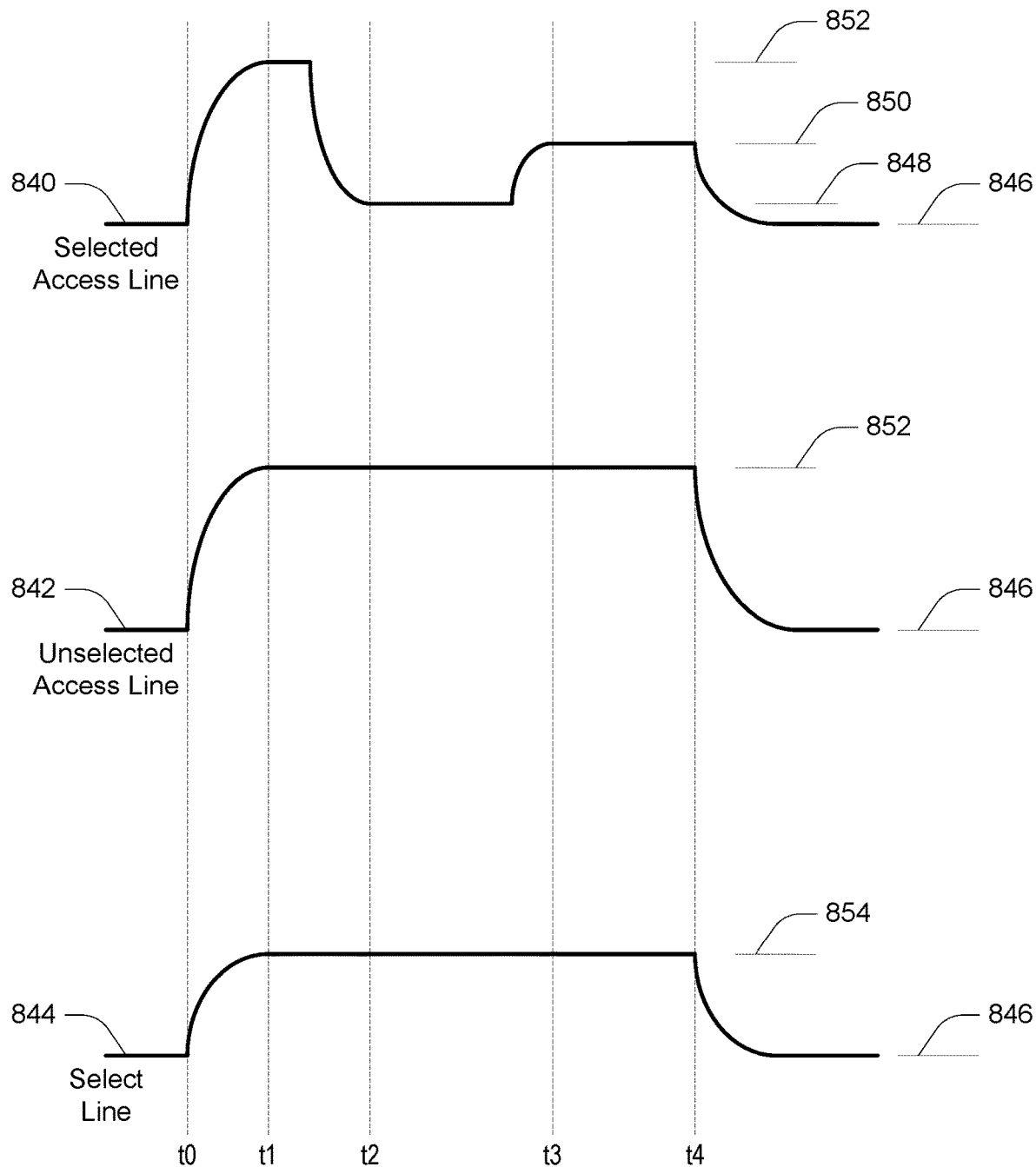
FIG. 8 depicts a timing diagram for a method of operating a memory in accordance with an embodiment.

FIG. 8 depicts a timing diagram for a method of operating a memory in accordance with an embodiment. For example, the timing diagram of FIG. 8 might represent a read operation of a memory. Trace 840 might represent the voltage level applied to an access line connected to a memory cell selected for the read operation, e.g., a target memory cell. The following discussion will be made with reference to at least FIG. 2A and will presume that the memory cell selected for the read operation is the memory cell $208_x$ of the NAND string $206_0$, such that trace 840 might represent the voltage level applied to access line $202_x$. The access line $202_x$ may be referred to as the selected access line as it contains the target memory cell, while remaining access lines 202 may be referred to as unselected access lines. The NAND string $206_0$ may be referred to as the selected string of series-connected memory cells as it contains the target memory cell. Trace 842 might represent the voltage level applied to the unselected access lines 202, e.g., access lines $202_0$-$202_{x-1}$ and $202_{x+1}$-$202_N$. Trace 844 might represent the voltage level applied to the select line 214 and/or the voltage level applied to the select line 215.

At time $t_0$, a precharge phase might begin. The precharge phase of the read operation brings the unselected access lines 202 to a voltage level sufficient to activate their respective connected memory cells regardless of their data states, e.g., the pass voltage. As shown in the example of FIG. 8, the voltage levels of all access lines 202 of the block of memory cells containing the target memory cell (e.g., one or more target memory cells) are initially brought up to a voltage level 852. The voltage level 852 may be sufficient to activate each memory cell connected to one of the access lines 202 regardless of their data state. As one example, voltage level 852 might be approximately 8V. Bringing all of the access lines 202 up together in this manner may facilitate improvements in speed to steady state of any access line 202 whose desired voltage level is the voltage level 852. The select line 214 and the select line 215 might be brought up to a voltage level 854 sufficient to activate their respective select gates.

As the access lines 202 (e.g., traces 840 and 842) are being increased to the voltage level 852, a preliminary sensing of data lines 204 (e.g., some subset or all of the data lines $204_0$-$204_M$) might be performed in accordance with embodiments and as described in more detail with reference to the following figures. In response to the rising voltage level applied to each of the access lines 202 between time t0 and t1, NAND strings 206 might begin to enable current flow between the data line 204 and the source 216. The voltage level at which conduction occurs for every data line 204 associated with the read operation might provide information regarding an expected pass voltage to use for reading memory cells 208 of the block of memory cells during the read operation. As an example, the increasing voltage level applied to the access lines 202 (e.g., traces 840 and 842) might be continued until conduction is sensed in every data line 204 associated with the read operation, and the voltage level 852 might be equal to or higher than the voltage level when such conduction is sensed. For example, in response to conduction being sensed in every data line 204 associated with the read operation, a respective counter 642 for each of one or more voltage generation devices 646 might be disabled to cease increasing the voltage levels of the respective outputs 648 at time t1.

At or around time t1, the selected access line $202_x$ might be discharged to a voltage level 848. The voltage level 848 might represent a read voltage intended to distinguish between possible data states of the target memory cell. For example, if the target memory cell is activated while the voltage level 848 is applied to the access line $202_x$, and thus to the control gate of the target memory cell, it may be deemed to have a data state corresponding to a range of threshold voltages lower than or equal to the voltage level 848. If the target memory cell is deactivated while the voltage level 848 is applied to the access line $202_x$, it may be deemed to have a data state corresponding to a range of threshold voltages higher than the voltage level 848. A sensing operation might be performed while the voltage level 848 is being applied, as is well understood in the art. As one example, the voltage level 848 might correspond to a voltage level applied to the access lines 202 at a time when it was determined that one or more NAND strings 206 having memory cells 208 (e.g., each of its memory cells) programmed to a particular data state, e.g., the L0 data state or a lowest data state, were all activated.

While the voltage level 848 is being applied to the selected access line $202_x$ at time t2, the voltage level 852 is being applied to the unselected access lines $202_0$-$202_{x-1}$ and $202_{x+1}$-$202_N$. The voltage level 852 is sufficient to activate the memory cells connected to these unselected access lines regardless of their data state. In addition, while the voltage level 848 is being applied to the selected access line $202_x$ at time t2, the voltage level 854 might be applied to the select line 214 and to the select line 215. The voltage level 854 is sufficient to activate the select gates connected to these select lines. In this manner, current flow may be established through the NAND string 206 if the target memory cell is activated, thus permitting sensing of its data state. As one example, the voltage level 854 might be approximately 5V.

At time t3, the voltage level applied to the selected access line $202_x$ might be increased to the voltage level 850 while voltage levels of the other traces 842 and 844 might be maintained. The voltage level 850 might represent a different read voltage intended to distinguish between different possible data states of the target memory cell. A sensing operation might be performed while the voltage level 850 is being applied, as is well understood in the art. As one example, the voltage level 850 might correspond to a voltage level applied to the access lines 202 at a time when it was determined that one or more NAND strings 206 having memory cells 208 (e.g., each or some subset of its memory cells) programmed to a next higher data state, e.g., the L1 data state, were all activated. While only two read voltages are depicted in FIG. 8, other numbers of read voltages might be used. In general, Y read voltages might be used to distinguish between each of Y+1 possible data states. At time t4, all of the lines might be discharged to the voltage level 846, which might be a reference potential, e.g., ground or 0V. The period between time t2 and t4, for each read voltage of the read operation, might correspond to a sensing phase of the read operation when the data states of one or more target memory cells are sensed.

Figure 9A:
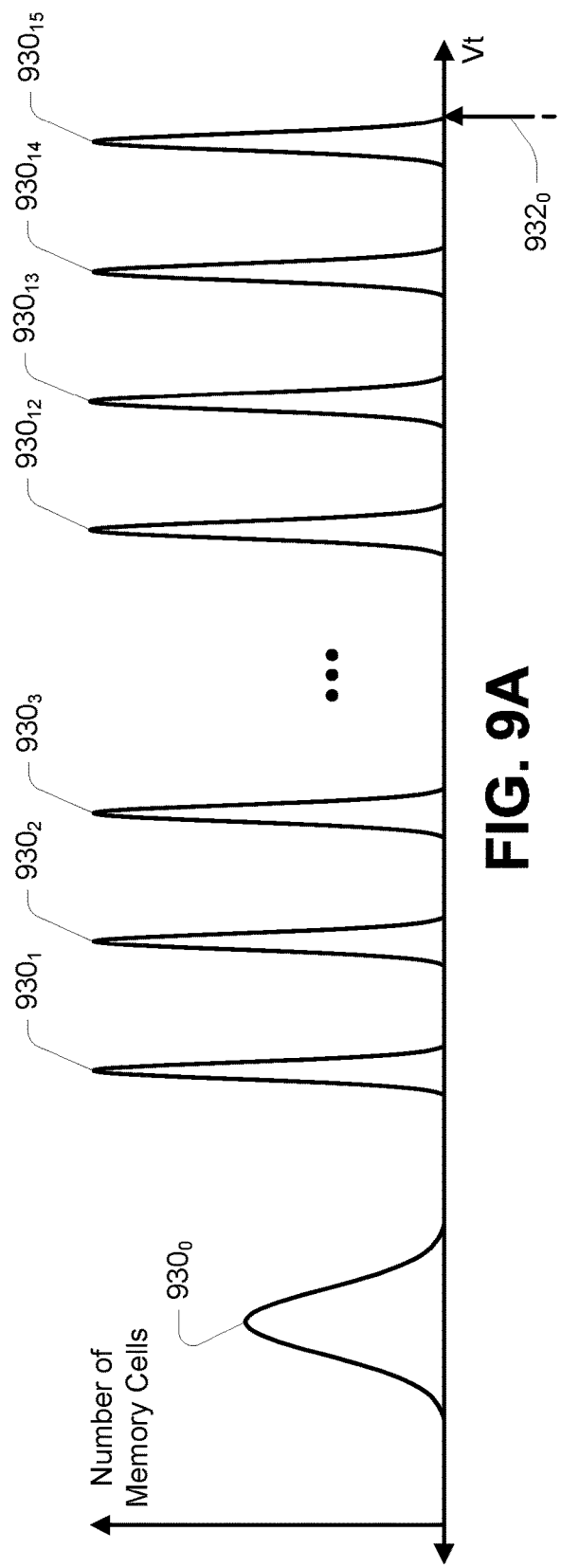
FIGS. 9A-9B are conceptual depictions of threshold voltage distributions of a plurality of memory cells at differing data ages in accordance with an embodiment.
Figure 9B:
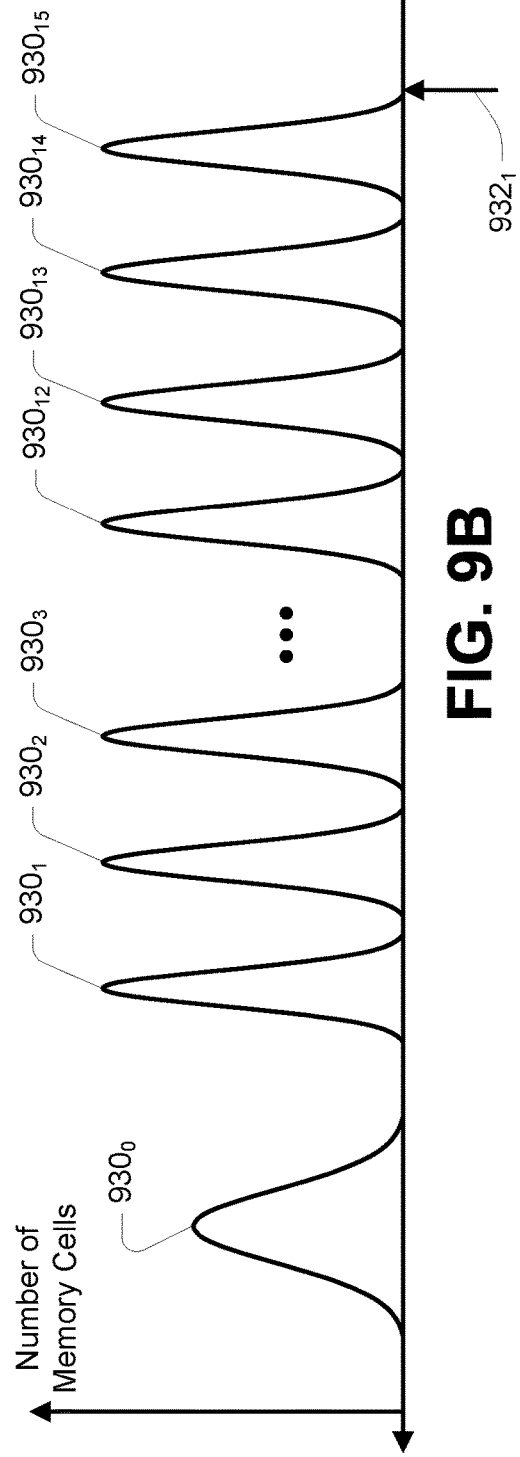

FIGS. 9A-9B are conceptual depictions of threshold voltage distributions of a plurality of memory cells at differing data ages according to an embodiment. FIG. 9A might represent memory cells to be read at a particular data age, while FIG. 9B might represent memory cells to be read at a different data age, e.g., some period of time subsequent to the particular data age. For example, the particular data age in FIG. 9A might be immediately subsequent to programming, while the different data age in FIG. 9B might be one or more time decades later. FIG. 9B conceptually depicts typical threshold voltage widening and shifting (e.g., downward shifting) with increasing data age. FIGS. 9A-9B will be used to provide additional detail regarding the process between times t0 and t1 in FIG. 8.

Consider the example where a block of memory cells 250 is programmed to have memory cells 208 for each of the possible data states. The threshold voltage ranges $930_0$-$930_{15}$ might each represent the distribution of threshold voltages of memory cells programmed to a corresponding respective data state, e.g., L0-L15, respectively. Although data intended for programming to memory cells might not include similarly sized distributions of each of the possible data states, and might be devoid of one or more of the data states, it is typical to utilize data randomization prior to programming such that the data programmed to the memory cells might approach a random distribution of all of the possible data states. Accordingly, in a read operation, it might be typical that each of the possible data states would be represented by memory cells involved in that read operation, e.g., both the selected and the unselected memory cells. However, there is no requirement for each data state to be represented.

With reference to FIG. 9A, as the voltage level applied to the access lines 202 (e.g., traces 840 and 842) are increased between time t0 and t1 of FIG. 8 for a read operation of memory cells of the particular data age, the NAND strings 206 involved in that read operation might all be enabled for current flow between their respective data line 204 and the source 216 when the voltage level reaches the voltage level $932_0$, e.g., a voltage level greater than or equal to the threshold voltages of each of the memory cells of the plurality of memory cells involved in that read operation, including selected and unselected memory cells. The increasing of the voltage level applied to the access lines 202 (e.g., traces 840 and 842) might then be ceased as all memory cells would be sensed to be activated.

With reference to FIG. 9B, as the voltage level applied to the access lines 202 (e.g., traces 840 and 842) are increased between time t0 and t1 of FIG. 8 for a read operation of memory cells of the different data age, the NAND strings 206 involved in that read operation might all be enabled for current flow between their respective data line 204 and the source 216 when the voltage level reaches the voltage level $932_1$, e.g., a voltage level greater than or equal to the threshold voltages of each of the memory cells of the plurality of memory cells involved in that read operation, including selected and unselected memory cells. The increasing of the voltage level applied to the access lines 202 (e.g., traces 840 and 842) might then be ceased as all memory cells would be sensed to be activated.

By ceasing the increase of the voltage level applied to the access lines 202 during the precharge portion of a read operation in response to the respective data lines 204 having the conductive state, decreasing voltage levels of the pass voltage might be used for increasing values of data age. This might facilitate improvements in failure rates of the memory. For example, the read capability of a memory, often expressed in terms of a number of reads that might be performed before failure of a read operation, generally decreases exponentially with increasing voltage stress, and thus read disturb, of the memory cells. Voltage stress can occur through the application of a pass voltage to unselected memory cells. Accordingly, reducing the voltage level of the pass voltage in response to increasing values of data age might facilitate reductions in voltage stress, and thus increases in read capability.

Figures 10A, 10B, 11:
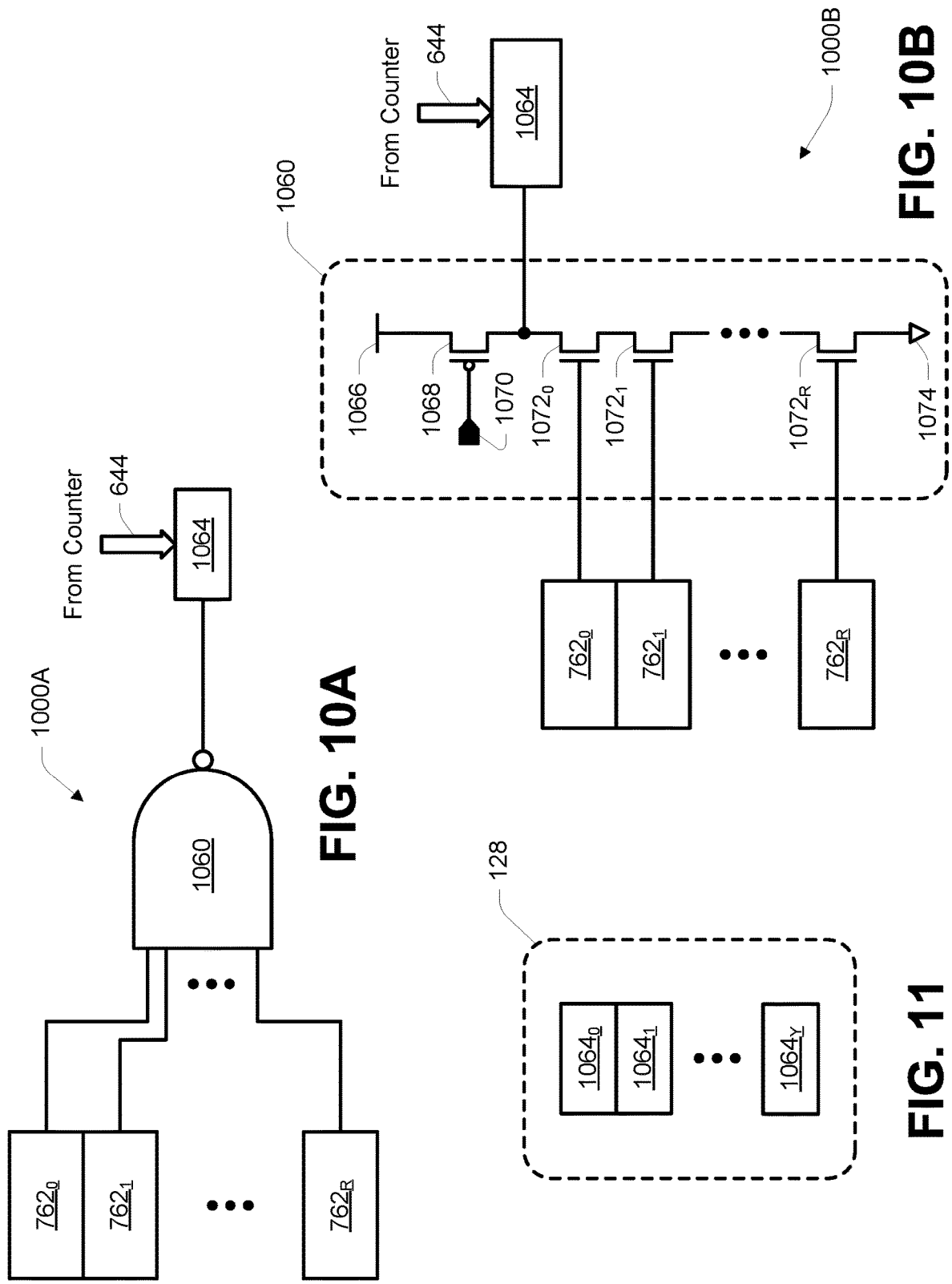
FIGS. 10A-10B are block schematics of decoding circuitry for use in determining a pass voltage in accordance with embodiments.
FIG. 11 is a block schematic of a register bank in accordance with embodiments.

FIGS. 10A-10B are block schematics of decoding circuitry for use in determining a pass voltage in accordance with embodiments. The decoding circuitry 1000A of FIG. 10A includes a logic circuit, e.g., a NAND gate, 1060. The logic circuit 1060 may have a plurality of inputs, each in communication with (e.g., connected to receive) a value of a respective register 762 (e.g., one of the registers $762_0$-$762_R$) of a page buffer, e.g., page buffer 352 of FIG. 3. The value of R might be any integer value greater than or equal to 1, where R+1 represents a number of NAND strings 206 having a selected memory cell of the read operation, e.g., each NAND string being sensed during the read operation.

The logic circuit 1060 might have a first logic level (e.g., a logic high level) when a NAND string 206 and data line 204 corresponding to any of the registers $762_0$-$762_R$ remains inhibited from conducting, and might have a second logic level different than the first logic level (e.g., a logic low level) when the NAND strings 206 and data lines 204 corresponding to all of the registers $762_0$-$762_R$ are enabled to conduct. A register 1064 might be in communication with (e.g., connected to receive) a value of the output of the logic circuit 1060, and in communication with (e.g., connected to receive) a representation of a count from the output 644 of the counter 642. The register 1064 might be a part of the register bank 128 of FIG. 1. The register 1064 might further be configured to latch the representation of the count from the output 644 of the counter 642 into the register 1064 in response to a logic level of the output of the logic circuit 1060. For example, when the logic circuit 1060 toggles from its first logic level to its second logic level, the register 1064 might latch the representation of the count. The output of the logic circuit 1060 might further be used to disable the counter 642, e.g., to cease increasing the voltage level of the voltage generation circuit 646.

The decoding circuitry 1000B of FIG. 10B provides a schematic of one implementation of the logic circuit 1060. The logic circuit 1060 of the decoding circuitry 1000B might include a transistor (e.g., a p-type field-effect transistor or pFET) 1068 having a first source/drain (e.g., drain) connected to a first voltage node 1066. The first voltage node 1066 might be configured to receive a supply voltage, e.g., Vcc. The pFET 1068 might further have a second source/drain (e.g., source) in communication with the register 1064, e.g., connected to the output of the logic circuit 1060. The logic circuit 1060 might have its plurality of inputs each connected to a control gate of a respective transistor (e.g., an n-type field-effect transistor or nFET) 1072 (e.g., nFETs $1072_0$-$1072_R$). The nFETs $1072_0$-$1072_R$ might be connected in series between the second source/drain of the pFET 1068 and a second voltage node 1074. The second voltage node 1074 might be configured to receive a reference potential, e.g., ground or 0V.

FIG. 11 is a block schematic of a register bank 128 in accordance with embodiments. The register bank 128 might have a set of registers 1064 (e.g., registers $1064_0$-$1064_N$). Each register 1064 of the set of registers of the register bank 128 might correspond to a respective grouping of memory cells (e.g., page of memory cells) of a corresponding block of memory cells 250, and may each be configured to latch a representation of a voltage level at which each NAND string involved in a read operation of its respective grouping of memory cells indicated current flow. The register $1064_0$ might store an indication of a pass voltage that could be used for a grouping of memory cells connected to the access line $202_0$, the register $1064_1$ might store an indication of a pass voltage that could be used for a grouping of memory cells connected to the access line $202_1$, the register $1064_2$ might store an indication of a pass voltage that could be used for a grouping of memory cells connected to the access line $202_2$, the register $1064_3$ might store an indication of a pass voltage that could be used for a grouping of memory cells connected to the access line $202_3$, and so on.

For some embodiments, the set of registers $106_4$ of the register bank 128 might have registers for only a proper subset groupings of memory cells for its corresponding block of memory cells 250. For such embodiments, a particular register 1064 for one grouping of memory cells might be used to determine the pass voltage for a different grouping of memory cells, either within the same block of memory cells 250 or a different block of memory cells 250. For some embodiments, the register bank 128 might have a respective set of registers 1064 for each block of memory cells 250, or some proper subset of blocks of memory cells 250, of an array of memory cells 104. For such embodiments, the set of registers 1064 for one block of memory cells 250 might be used to determine pass voltages for a different block of memory cells 250.

Figure 12:
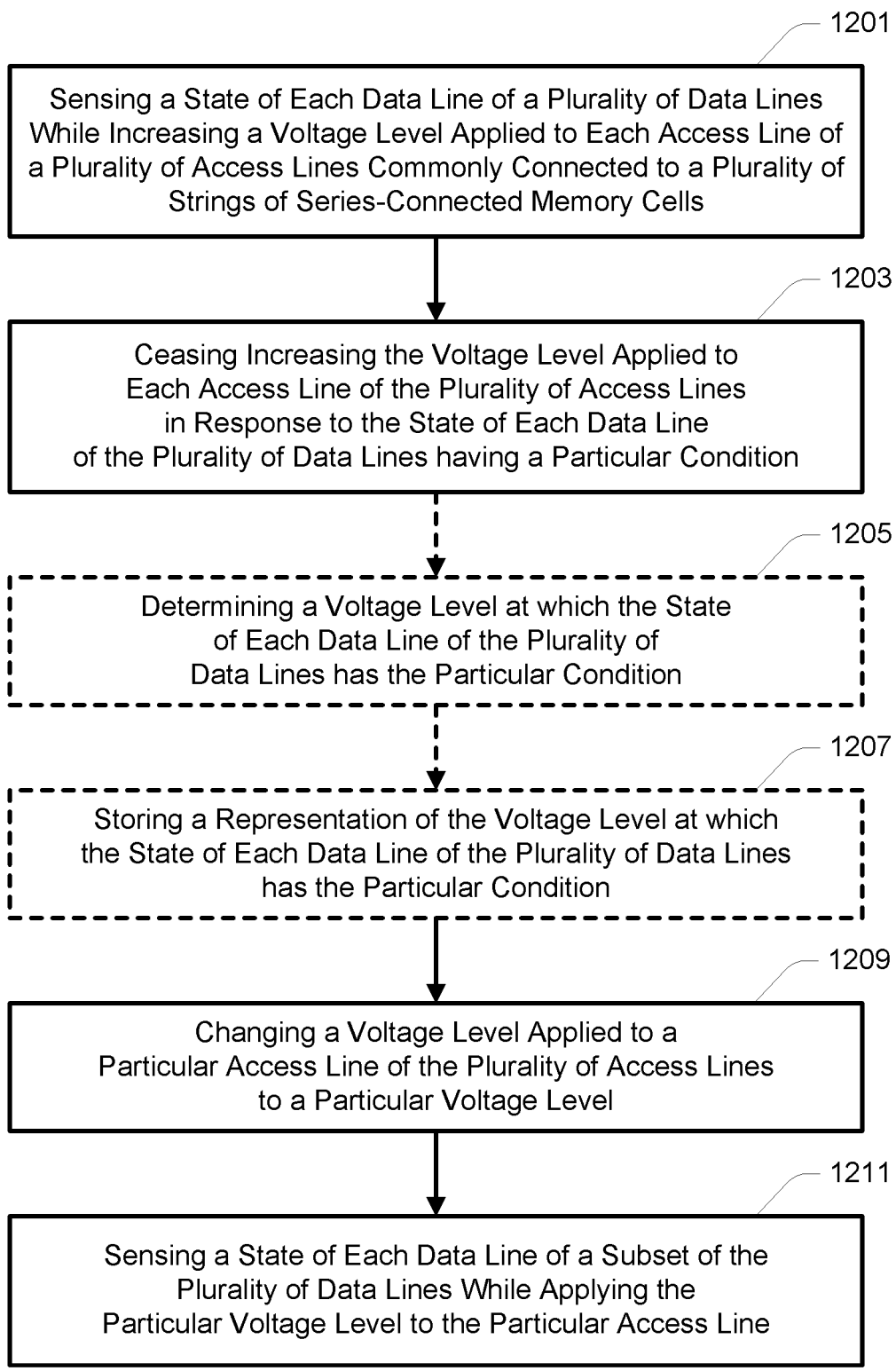
FIG. 12 is a flowchart of a method of operating a memory in accordance with an embodiment.

FIG. 12 is a flowchart of a method of operating a memory in accordance with an embodiment. For example, the method of FIG. 12 might be a portion of a read operation.

At 1201, a state of each data line of a plurality of data lines might be sensed while increasing a voltage level applied to each access line of a plurality of access lines commonly connected to a plurality of strings of series-connected memory cells. This may include increasing the voltage level applied to all access lines commonly connected to the plurality of strings of series-connected memory cells, e.g., such that the control gate of every memory cell of these strings of series-connected memory cells are receiving the increasing voltage level. For example, an increasing voltage level such as described with reference to FIGS. 5-6 might be applied to each of the access lines.

The plurality of data lines might be each data line selectively connected to a block of memory cells (or a plurality of blocks of memory cells) of a memory plane. Alternatively, the plurality of data lines might be less than all data lines selectively connected to the block of memory cells. For example, where a read operation only seeks to sense data states of memory cells connected to every other data line selectively connected to a block of memory cells, the plurality of data lines might be every other (e.g., even or odd) data line selectively connected to that block of memory cells. Likewise, the plurality of strings of series-connected memory cells might be each string of series-connected memory cells of the selected block of memory cells, or less than all strings of series-connected memory cells of the selected block of memory cells, e.g., every other (e.g., even or odd) string of series-connected memory cells of the selected block of memory cells.

Each string of series-connected memory cells of the plurality of strings of series-connected memory cells might correspond to a respective data line of the plurality of data lines, e.g., in a one-to-one relationship. While sensing the state of each data line of the plurality of data lines, select gates (e.g., drain select gates and/or source select gates) corresponding to each string of series-connected memory cells of the plurality of strings of series-connected memory cells might be activated.

At 1203, increasing the voltage level applied to each access line of the plurality of access lines might be ceased in response to the state of each data line of the plurality of data lines having a particular condition. For example, an initial state of a data line might be floating, e.g., isolated from a source by a deactivated memory cell of its corresponding string of series-connected memory cells, and it might be precharged to a particular voltage level, e.g., Vcc. As the increasing voltage level applied to the plurality of access lines reaches a voltage level sufficient to activate each memory cell of that corresponding string of series-connected memory cells, the state of that data line might change to conducting, e.g., connected to the source through its corresponding string of series-connected memory cells. As such, the particular condition might be conducting.

Ceasing increasing the voltage level might include disabling a counter. For example, if a DAC is generating an increasing voltage level in response to a count from a counter, the counter might be disabled in response to determining when each data line of the plurality of data lines is conducting. Disabling the counter might stop increasing the count, and thus maintaining the voltage level at a value sufficient to activate each memory cell of the plurality of strings of series-connected memory cells. For some embodiments, a delay might be utilized subsequent to when each data line of the plurality of data lines is determined to have the particular condition. For example, the counter might be disabled a particular period of time after determining that each data line of the plurality of data lines is conducting. This might allow the voltage level to increase by some predetermined amount. While generally unnecessary for the subsequent reading of data states of memory cells selected for the read operation, the additional voltage level might serve to decrease resistance of the strings of series-connected memory cells, which might serve to improve the speed of the read operation, for example.

At 1205, for some embodiments, a voltage level at which the state of each data line of the plurality of data lines has the particular condition might be determined. This voltage level might be determined at or following a time when it is determined that each data line of the plurality of data lines has the particular condition. For example, the value of a counter used to generate the increasing voltage level might determine, and indicate, this voltage level. At 1207, for some embodiments, a representation of this voltage level might be stored, e.g., to a register bank. Continuing with the example, the value of the counter might be stored.

At 1209, a voltage level applied to a particular access line of the plurality of access lines might be changed (e.g., decreased) to a particular voltage level, e.g., after ceasing increasing the voltage level applied to each access line of the plurality of access lines. The particular access line might be an access line selected for a read operation, e.g., connected to a control gate of a target memory cell whose data state is to be sensed during the read operation. For some embodiments, the voltage level applied to the particular access line might be decreased to the particular voltage level. For other embodiments, the voltage level applied to the particular access line might be decreased to a voltage level lower than the particular voltage level. The voltage level applied to the particular access line might be decreased without decreasing (e.g., while maintaining) the voltage level applied to each remaining access line of the plurality of access lines.

At 1211, a state of each data line of a subset of the plurality of data lines is sensed while applying the particular voltage level to the particular access line. Sensing the state of each data line of the subset of the plurality of data lines might include determining whether each data line of the subset of the plurality of data lines is connected to, or isolated from, the source through its corresponding string of series-connected memory cells, e.g., depending upon a state of the memory cell of its corresponding string of series-connected memory cells connected to the particular access line responsive to the particular voltage level being applied to its control gate.

Sensing the state of each data line of the subset of the plurality of data lines might occur without decreasing (e.g., while maintaining) the voltage level applied to each access line of the plurality of access lines other than the particular access line. Similarly, while sensing the state of each data line of the subset of the plurality of data lines, select gates (e.g., drain select gates and/or source select gates) corresponding to each string of series-connected memory cells corresponding to the subset of the plurality of data lines might be activated. The subset of the plurality of data lines may be a proper subset of the plurality of data lines, or the whole set of data lines (e.g., each data line) of the plurality of data lines.

The process of 1209 and 1211 might be repeated while applying different voltage levels to the particular access line. For example, the particular voltage level might correspond to a first (e.g., lowest) read voltage used to distinguish between data states of a plurality of data states of the read operation. After sensing the state of each data line of the subset of the plurality of data lines while applying the particular voltage level to the particular access line, the voltage level of the particular access line might be changed (e.g., increased) to a next subsequent voltage level (e.g., next higher read voltage) and sensing the state of each data line of the subset of the plurality of data lines might be repeated while applying the next subsequent voltage level to the particular access line and while maintaining the voltage level on the remaining access lines, and so on.

In addition, the stored representation of the voltage level at which the state of each data line of the plurality of data lines has the particular condition might be used to determine the pass voltage for a subsequent read operation on the same, or a different, plurality of strings of series-connected memory cells, e.g., without sensing the state of each data line of the plurality of data lines while increasing the voltage level applied to the plurality of access lines to determine when the state of each data line has the particular condition.

For example, the stored representation of the voltage level at which the state of each data line of the plurality of data lines has the particular condition might be used to determine the pass voltage for a subsequent read operation where a different access line of the plurality of access lines receives the particular voltage level. Alternatively, the stored representation of the voltage level at which the state of each data line of the plurality of data lines has the particular condition might be used to determine the pass voltage for a subsequent read operation on a different plurality of strings of series-connected memory cells, e.g., a different block of memory cells of a same or a different memory plane.

Figure 13:
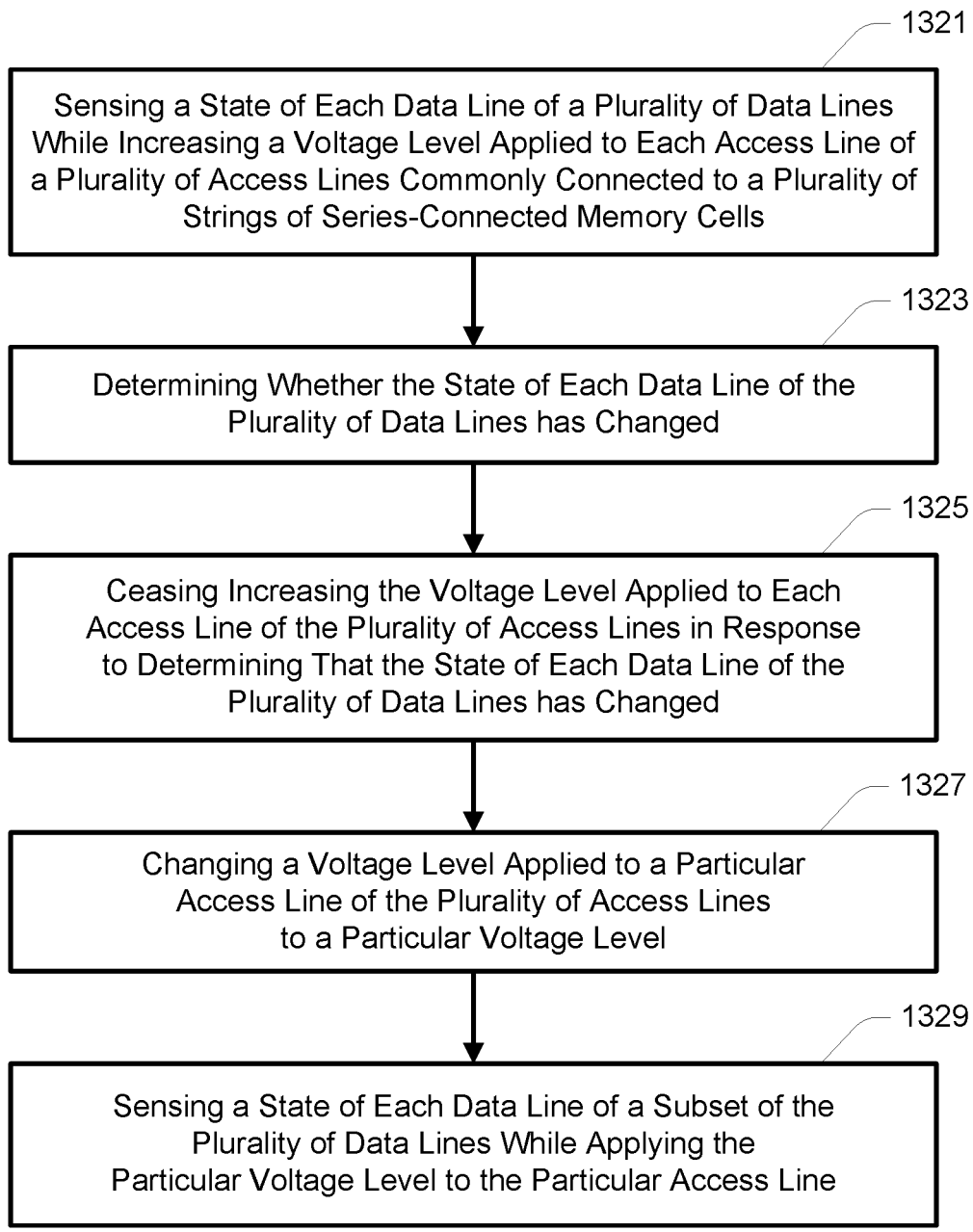
FIG. 13 is a flowchart of a method of operating a memory in accordance with another embodiment.

FIG. 13 is a flowchart of a method of operating a memory in accordance with another embodiment. For example, the method of FIG. 13 might be a portion of a read operation.

At 1321, a state of each data line of a plurality of data lines might be sensed while increasing a voltage level applied to each access line of a plurality of access lines commonly connected to a plurality of strings of series-connected memory cells. This may include increasing the voltage level applied to all access lines commonly connected to the plurality of strings of series-connected memory cells, e.g., such that the control gate of every memory cell of these strings of series-connected memory cells are receiving the increasing voltage level. For example, an increasing voltage level such as described with reference to FIGS. 5-6 might be applied to each of the access lines.

The plurality of data lines might be each data line selectively connected to a block of memory cells (or a plurality of blocks of memory cells) of a memory plane. Alternatively, the plurality of data lines might be less than all data lines selectively connected to the block of memory cells. For example, where a read operation only seeks to sense data states of memory cells connected to every other data line selectively connected to a block of memory cells, the plurality of data lines might be every other (e.g., even or odd) data line selectively connected to that block of memory cells. Likewise, the plurality of strings of series-connected memory cells might be each string of series-connected memory cells of the selected block of memory cells, or less than all strings of series-connected memory cells of the selected block of memory cells, e.g., every other (e.g., even or odd) string of series-connected memory cells of the selected block of memory cells.

Each string of series-connected memory cells of the plurality of strings of series-connected memory cells might correspond to a respective data line of the plurality of data lines, e.g., in a one-to-one relationship. While sensing the state of each data line of the plurality of data lines, select gates (e.g., drain select gates and/or source select gates) corresponding to each string of series-connected memory cells of the plurality of strings of series-connected memory cells might be activated.

At 1323, it might be determined whether the state of each data line of the plurality of data lines has changed. For example, an initial state of a data line might be floating, e.g., isolated from a source by a deactivated memory cell of its corresponding string of series-connected memory cells, and it might be precharged to a particular voltage level, e.g., Vcc. As the increasing voltage level applied to the plurality of access lines reaches a voltage level sufficient to activate each memory cell of that corresponding string of series-connected memory cells, the state of that data line might change to conducting, e.g., connected to the source through its corresponding string of series-connected memory cells.

At 1325, increasing the voltage level applied to each access line of the plurality of access lines might be ceased in response to determining when the state of each data line of the plurality of data lines has changed. For example, if a DAC is generating an increasing voltage level in response to a count from a counter, the counter might be disabled in response to determining when each data line of the plurality of data lines is conducting.

At 1327, the voltage level applied to a particular access line of the plurality of access lines might be changed (e.g., decreased) to a particular voltage level, e.g., after ceasing increasing the voltage level applied to each access line of the plurality of access lines. The particular access line might be an access line selected for a read operation, e.g., connected to a control gate of a target memory cell whose data state is to be sensed during the read operation. For some embodiments, the voltage level applied to the particular access line might be decreased to the particular voltage level. For other embodiments, the voltage level applied to the particular access line might be decreased to a voltage level lower than the particular voltage level. The voltage level applied to the particular access line might be decreased without decreasing (e.g., while maintaining) the voltage level applied to each remaining access line of the plurality of access lines.

At 1329, a state of each data line of a subset of the plurality of data lines is sensed while applying the particular voltage level to the particular access line. Sensing the state of each data line of the subset of the plurality of data lines might include determining whether each data line of the subset of the plurality of data lines is connected to, or isolated from, the source through its corresponding string of series-connected memory cells, e.g., depending upon a state of the memory cell of its corresponding string of series-connected memory cells connected to the particular access line responsive to the particular voltage level being applied to its control gate.

Sensing the state of each data line of the subset of the plurality of data lines might occur without decreasing (e.g., while maintaining) the voltage level applied to each access line of the plurality of access lines other than the particular access line. Similarly, while sensing the state of each data line of the subset of the plurality of data lines, select gates (e.g., drain select gates and/or source select gates) corresponding to each string of series-connected memory cells corresponding to the subset of the plurality of data lines might be activated. The subset of the plurality of data lines may be a proper subset of the plurality of data lines, or the whole set of data lines (e.g., each data line) of the plurality of data lines.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
an array of memory cells comprising a plurality of strings of series-connected memory cells;
a plurality of access lines, each access line of the plurality of access lines connected to a respective memory cell of each string of series-connected memory cells of the plurality of strings of series-connected memory cells;
a plurality of data lines, each data line of the plurality of data lines selectively connected to a respective string of series-connected memory cells of the plurality of strings of series-connected memory cells;
a voltage generation system having an output selectively connected to an access line of the plurality of access lines;
a plurality of sensing devices, each sensing device of the plurality of sensing devices connected to a respective data line of the plurality of data lines;
a plurality of registers, each register of the plurality of registers configured to change from a first value to a second value responsive to an output of a respective sensing device of the plurality of sensing devices changing logic levels while the voltage generation system is increasing a voltage level at its output and while the output of the voltage generation system is connected to the access line; and
a logic circuit configured to output a first logic level in response to each register of the plurality of registers having its second value and to output a second logic level, different than its first logic level, in response to any register of the plurality of registers having its first value;
wherein the voltage generation system is configured to cease increasing the voltage level at its output in response to the logic circuit outputting its first logic level.

2. The apparatus of claim 1, wherein the voltage generation system of the apparatus comprises:
a counter; and
a voltage generation circuit responsive to an output of the counter, and having an output selectively connected to the access line of the plurality of access lines;
wherein the voltage generation system being configured to cease increasing the voltage level at its output in response to the logic circuit outputting its first logic level comprises the voltage generation system being configured to disable the counter in response to the logic circuit outputting its first logic level.

3. The apparatus of claim 2, wherein the voltage generation system being configured to cease increasing the voltage level at its output in response to the logic circuit outputting its first logic level comprises the voltage generation system being configured to cease increasing the voltage level at its output after a predetermined delay following the logic circuit outputting its first logic level.

4. The apparatus of claim 2, wherein the plurality of registers is a plurality of first registers, and wherein the apparatus further comprises:
a plurality of second registers, each second register of the plurality of second registers corresponding to a respective first register of the plurality of first registers and configured to latch a value of the counter in response to the value of its respective first register changing from its first value to its second value.

5. The apparatus of claim 4, wherein the apparatus is configured to determine a data value stored in a memory cell of the respective string of series-connected memory cells of the respective data line of the respective sensing device of the respective first register of a particular second register of the plurality of second registers in response to a subsequent value of the counter latched in the particular second register.

6. The apparatus of claim 2, wherein the counter is a first counter of a plurality of counters of the apparatus, wherein the voltage generation circuit is a first voltage generation circuit of a plurality of voltage generation circuits of the apparatus, and wherein the access line of the plurality of access lines is a first access line of the plurality of access lines, the apparatus further comprising:
- a second counter of the plurality of counters; and
- a second voltage generation circuit of the plurality of voltage generation circuits responsive to an output of the second counter, and having an output selectively connected to a second access line of the plurality of access lines.

7. The apparatus of claim 6, wherein the first access line corresponds to an access line of the plurality of access lines selected for a read operation on the plurality of strings of series-connected memory cells, and wherein the second access line corresponds to an access line of the plurality of access lines unselected for the read operation.

8. The apparatus of claim 6, wherein the output of the second voltage generation circuit is further selectively connected to at least one additional access line of the plurality of access lines.

9. The apparatus of claim 8, wherein each access line of the at least one additional access line of the plurality of access lines corresponds to an access line of the plurality of access lines unselected for the read operation.

10. A memory, comprising:
- an array of memory cells comprising a plurality of strings of series-connected memory cells;
- a plurality of access lines, each access line of the plurality of access lines connected to a respective memory cell of each string of series-connected memory cells of the plurality of strings of series-connected memory cells;
- a plurality of data lines, each data line of the plurality of data lines selectively connected to a respective string of series-connected memory cells of the plurality of strings of series-connected memory cells; and
- a controller for access of the array of memory cells, wherein the controller, during a read operation on the plurality of strings of series-connected memory cells, is configured to cause the memory to:
  - concurrently increase a respective voltage level applied to each access line of the plurality of access lines during the read operation on the plurality of strings of series-connected memory cells while each data line of the plurality of data lines is connected to its respective string of series-connected memory cells and while each string of series-connected memory cells of the plurality of strings of series-connected memory cells is connected to a common source; and
  - cease increasing the respective voltage level applied to each access line of the plurality of access lines in response to determining that each data line of the plurality of data lines is connected to the common source through its respective string of series-connected memory cells.

11. The memory of claim 10, wherein the controller is further configured to cause the memory to store a representation of the respective voltage level applied to a particular access line of the plurality of access lines at a time of ceasing increasing the respective voltage level applied to each access line of the plurality of access lines in response to determining that each data line of the plurality of data lines is connected to the common source through its respective string of series-connected memory cells.

12. The memory of claim 11, wherein the controller is further configured to cause the memory to use the stored representation of the respective voltage level applied to the particular access line to determine a pass voltage for a subsequent read operation on the plurality of strings of series-connected memory cells.

13. A memory, comprising:
- an array of memory cells comprising a plurality of strings of series-connected memory cells selectively connected to a common source;
- a plurality of access lines, each access line of the plurality of access lines connected to a respective memory cell of each string of series-connected memory cells of the plurality of strings of series-connected memory cells;
- a plurality of data lines, each data line of the plurality of data lines selectively connected to a respective string of series-connected memory cells of the plurality of strings of series-connected memory cells;
- a plurality of voltage generation systems; and
- a controller for access of the array of memory cells, wherein the controller, during a read operation on the plurality of strings of series-connected memory cells, is configured to cause the memory to:
  - for each voltage generation system of the plurality of voltage generation systems, increase a respective voltage level of a respective output of that voltage generation system while the output of that voltage generation system is connected to a respective access line of the plurality of access lines;
  - determine whether each string of series-connected memory cells of the plurality of strings of series-connected memory cells has connected its respective data line to the common source while increasing the respective voltage level of the respective output of each voltage generation system of the plurality of voltage generation systems; and
  - cease increasing the respective voltage level of the respective output of each voltage generation system of the plurality of voltage generation systems in response to determining that each string of series-connected memory cells of the plurality of strings of series-connected memory cells has connected its respective data line to the common source.

14. The memory of claim 13, wherein the plurality of strings of series-connected memory cells is a first plurality of strings of series-connected memory cells, wherein the plurality of data lines is a first plurality of data lines, wherein the array of memory cells comprises a block of memory cells, wherein the block of memory cells comprises the first plurality of strings of series-connected memory cells and a second plurality of strings of series-connected memory cells, wherein each access line of the plurality of access lines is further connected to a respective memory cell of each string of series-connected memory cells of the second plurality of strings of series-connected memory cells, wherein each string of series-connected memory cells of the second plurality of strings of series-connected memory cells is selectively connected to the common source, and wherein each string of series-connected memory cells of the second plurality of strings of series-connected memory cells is selectively connected to a respective data line of a second plurality of data lines of the memory.

15. The memory of claim 14, wherein the controller, during the read operation, is further configured to cause the memory to:
- determine whether each string of series-connected memory cells of the second plurality of strings of series-connected memory cells has connected its respective data line to the common source while increasing the respective voltage level of the respective output of each voltage generation system of the plurality of voltage generation systems; and cease increasing the respective voltage level of the respective output of each voltage generation system of the plurality of voltage generation systems in response to determining that each string of series-connected memory cells of the first plurality of strings of series-connected memory cells has connected its respective data line to the common source and determining that each string of series-connected memory cells of the second plurality of strings of series-connected memory cells has connected its respective data line to the common source.

16. The memory of claim 13, wherein the controller being configured to cause the memory to determine whether each string of series-connected memory cells of the plurality of strings of series-connected memory cells has connected its respective data line to the common source comprises the controller being configured to cause the memory to:

sense a respective state of each data line of the plurality of data lines while concurrently increasing the respective voltage levels of the respective outputs of each voltage generation system of the plurality of voltage generation systems; and determine when the respective state of each data line of the plurality of data lines indicates that all memory cells of the plurality of strings of series-connected memory cells are activated.

17. The memory of claim 16, wherein, after ceasing increasing the respective voltage level of the respective output of each voltage generation system of the plurality of voltage generation systems, the controller is further configured to cause the memory to:

decrease the respective voltage level of the respective output of a particular voltage generation system of the plurality of voltage generation systems to a particular voltage level; and sense the respective state of each data line of the plurality of data lines while the respective output of the particular voltage generation system is at the particular voltage level.

18. The memory of claim 17, wherein the controller is further configured to cause the memory to decrease the respective voltage level of the respective output of the particular voltage generation system without decreasing the respective voltage level of the respective output of any other voltage generation system of the plurality of voltage generation systems.

19. The memory of claim 17, wherein the controller is further configured to cause the memory to:

determine a voltage level of the particular voltage generation system at a time of ceasing increasing the respective voltage level of the respective output of each voltage generation system of the plurality of voltage generation systems; and store a representation of the voltage level of the particular voltage generation system at the time of ceasing increasing the respective voltage level of the respective output of each voltage generation system of the plurality of voltage generation systems.

20. The memory of claim 18, wherein the read operation on the plurality of strings of series-connected memory cells is a first read operation on the plurality of strings of series-connected memory cells, wherein the voltage level of the particular voltage generation system at the time of ceasing increasing the respective voltage level of the respective output of each voltage generation system of the plurality of voltage generation systems is a second voltage level, and wherein the controller, during a second read operation on the plurality of strings of series-connected memory cells, is further configured to cause the memory to:

for each voltage generation system of the plurality of voltage generation systems, increase the respective voltage level of the respective output of that voltage generation system to the second voltage level while the output of that voltage generation system is connected to a respective access line of the plurality of access lines;

decrease the respective voltage level of the respective output of one voltage generation system of the plurality of voltage generation systems to the particular voltage level without decreasing the respective voltage level of the respective output of any remaining voltage generation system of the plurality of voltage generation systems from the second voltage level; and sense the respective state of each data line of the plurality of data lines while the respective output of the one voltage generation system is at the particular voltage level.

* * * * *